United States Patent [19]

Horn et al.

[11] 4,304,841

[45] Dec. 8, 1981

[54] PHOTOPOLYMERIZABLE MIXTURE AND PHOTOPOLYMERIZABLE COPYING MATERIAL PRODUCED THEREWITH

[75] Inventors: Klaus Horn, Hofheim; Kurt Klüpfel, Wiesbaden, both of Fed. Rep. of Germany

[73] Assignee: Hoechst Aktiengesellschaft, Fed. Rep. of Germany

[21] Appl. No.: 204,204

[22] Filed: Nov. 5, 1980

[30] Foreign Application Priority Data

Nov. 7, 1979 [DE] Fed. Rep. of Germany ....... 2944866

[51] Int. Cl.³ ................................................ G03C 1/68
[52] U.S. Cl. .................................. 430/286; 430/281; 430/921; 430/917; 204/159.18; 204/159.24
[58] Field of Search .............. 430/281, 286, 921, 917; 204/159.18, 159.24

[56] References Cited

U.S. PATENT DOCUMENTS 4,045,231  8/1977  Toda et al. .......................... 430/286

Primary Examiner—Jack P. Brammer
Attorney, Agent, or Firm—James E. Bryan

[57] ABSTRACT

A photopolymerizable mixture is described which contains a polymeric binder, a compound which is polymerizable by a free radical mechanism and has at least two ethylenically unsaturated polymerizable groups, a photoinitiator, and additionally contains a disulfide compound of the formula

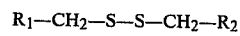

$$R_1-CH_2-S-S-CH_2-R_2$$

in which $R_1$ and $R_2$ are identical or different and are alkyl, cycloalkyl, aryl, aralkyl or N-substituted carbamoyl or carbamoylalkyl groups.

When applied as a photopolymerizable layer to a layer support, the mixture has a low sensitivity to atmospheric oxygen. Covering of the layer by oxygen-inhibiting cover sheets or cover layers is not required.

6 Claims, No Drawings

PHOTOPOLYMERIZABLE MIXTURE AND PHOTOPOLYMERIZABLE COPYING MATERIAL PRODUCED THEREWITH

This invention relates to a photopolymerizable mixture which contains a polymeric binder, an ethylenically unsaturated polymerizable compound and a photoinitiator, and to a copying material for the production of relief images, in particular printing forms and photoresists, which copying material is composed of a layer support and a photopolymerizable layer of the mixture.

Photopolymerizable mixtures and materials of the indicated generic type are known. When they are processed, it is necessary to eliminate the influence of atmospheric oxygen on the free-radical polymerization during exposure, or to suppress this as far as possible. In most cases, this is effected by covering the photopolymerizable layer with a cover sheet (U.S. Pat. No. 3,060,026) which can be peeled off and is impermeable to oxygen, or with a cover layer which is impermeable to oxygen and is soluble in the developer (U.S. Pat. No. 3,458,311). In this way, oxygen is prevented, during the light-induced polymerization, from diffusing into the layer and leading there to chain-stopping reactions which result in an incomplete polymerization and hence a lower light sensitivity. Due to the oxygen inhibition, in particular, the relationship between the incident amount of light and the exposure action, for example the degree of light curing—the reciprocity of the copying material is lost.

The disadvantage of the first-mentioned known materials is the additional working step which is required for the application of a cover film or cover layer. Moreover, the image resolution on contact printing deteriorates when self-supporting cover films are used, which as a rule have a thickness of about 20 μm. Cover layers which are soluble in the developer entail a more rapid consumption of the latter and an additional sewage contamination. Attempts have therefore been made to produce photopolymerizable materials which display an adequate light sensitivity in imagewise polymerization even without a cover layer.

German Offenlegungsschrift No. 2,830,143, describes a material of this type, which contains certain polymerizable compounds of relatively high molecular weight and certain initiator systems and therefore has a lower sensitivity to oxygen.

British Pat. No. 1,110,050, discloses a photopolymerizable mixture which contains relatively high-molecular weight polymerizable compounds and is thus less sensitive to oxygen.

Finally, German Auslegeschrift No. 2,103,996, describes a mixture which can be polymerized by irradiation and which is said to be less sensitive to oxygen due to its content of a certain binder.

In the earlier German patent application No. P 2,926,235, it is proposed to make the effect of the inhibition of polymerization by oxygen more uniform by using a photopolymerizable layer which contains pigment particles of a certain size.

Finally, U.S. Pat. Nos. 2,460,105, and 3,674,486, disclose the use of certain dialkyl disulfides as photoinitiators in photopolymerizable mixtures. A low oxygen sensitivity of these mixtures is not indicated. The initiator action of these compounds is relatively slight.

Among the possibilities which have been mentioned for reducing the oxygen sensitivity, only the use of impermeable cover layers, which are soluble in the developer, in particular in the case of planographic printing plates, and the use of impermeable cover films which can be peeled off, in particular in the case of photoresist materials and image transfer materials, have gained acceptance in practice. The mixtures which contain high molecular weight compounds with ethylenically unsaturated side groups which can be polymerized by a free radical mechanism, have not gained acceptance in practice; rather, low-molecular weight polymerizable compounds are generally preferred.

It is the object of the invention to provide a photopolymerizable mixture which has a low sensitivity to oxygen without requiring a protective layer or protective film against the oxygen, and the composition of which is not subject to any restrictions, caused by this object, with respect to the nature of the binder, the polymerizable compound and the active initiator system.

The starting point of the invention is a photopolymerizable mixture which contains a polymeric binder, a compound which is polymerizable by a free radical mechanism and has at least two ethylenically unsaturated polymerizable groups, and an adequate quantity of a photoinitiator for initiating the photoinitiated free-radical addition polymerization of the polymerizable compound.

The mixture according to the invention additionally contains a compound of the formula

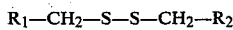

$$R_1-CH_2-S-S-CH_2-R_2$$

in which $R_1$ and $R_2$ are identical or different and are alkyl, cycloalkyl, aryl, aralkyl or N-substituted carbamoyl or carbamoylalkyl groups.

Disulfides of the indicated formula, wherein $R_1=R_2$, are in general preferred because they are the easiest to prepare.

If $R_1$ and $R_2$ are alkyl groups they generally have 1 to 20, preferably 4 to 15 carbon atoms. Cycloalkyl groups can have 3 to 20, preferably 6 to 15, carbon atoms and aryl groups can have 6 to 20 carbon atoms. The groups can contain further substituents, such as halogen atoms, lower alkyl and alkoxy groups having 1 to 4 carbon atoms, acyl groups having 2 to 7 carbon atoms and primary, secondary and tertiary amino groups.

The disulfides are in general added to the mixture in a quantity of 0.1 to 10, preferably 3 to 8, percent by weight, relative to the non-volatile constituents. The content of disulfide is frequently higher than that of photoinitiator. Nevertheless, it is found that the disulfides, certainly when the preferred highly active initiators indicated below are used, effect only a slight increase, or none at all, in the light sensitivity, even if their quantity is several times that of the initiator.

A substantial difference in the light sensitivity is observed, however, in the presence of oxygen, that is to say when using photopolymerizable layers, the surface of which is exposed to the atmosphere and is not covered by a cover layer or cover film, impermeable to oxygen. In the ideal case, complete reciprocity is achieved here, that is to say an imagewise photopolymerization which is proportional to the incident amount of light, namely the product of intensity of illumination and exposure time. In any case, however, a substantial reduction in the inhibition of polymerization due to oxygen is achieved, and this manifests itself by the fact that the extent of light curing increases with the amount of light over a wide range.

A further advantage of the mixture according to the invention is its low tendency to thermal polymerization in the dark, that is to say its increased storage life.

The mixture according to the invention can be utilized commercially in the form of a solution or dispersion, for example as a photoresist composition, which is applied by the user himself to an individual support, for example for chemical milling, for the manufacture of duplicate circuits, or stencils, letterings, screen printing forms and the like, and is exposed after drying and developed to give a layer in imagewise distribution.

In particular, the mixture also can be marketed in the form of a solid photopolymerizable layer, present on a support as a light-sensitive copying material for the preparation of printing forms, relief images, etch resists, stencils, mats, screen printing forms, ink test films, individual copies and the like. An important application is, above all, the manufacture of storable presensitized printing plates for letterpress printing, gravure printing and in particular planographic printing.

If the mixture is to be stored in liquid form as a photoresist composition, and is to be applied only immediately before use to the base, for example a screen printing support, a copper-laminated base material for the manufacture of printed circuit boards or the like, the layer constituents are dissolved or dispersed in a suitable solvent or mixture of solvents. Alcohols, ketones, esters, ethers, amides, hydrocarbons and the like are suitable solvents. Above all, the partial ethers of polyhydric alcohols, in particular of the glycols, are used.

For the manufacture of printing plates and the like, the solutions or dispersions advantageously can be applied immediately after their preparation to a suitable support and can be stored, and marketed, as light-sensitive copying materials. In this case, the same or similar solvents as for the manufacture of the photoresist compositions can be used. Application is carried out, for example, by casting, spraying, dipping and the like.

Examples of suitable layer carriers are zinc, copper, aluminum, steel, polyester or acetate film, polyamide gauze and the like, the surface of which can be subjected to a pretreatment if necessary.

If required, an adhesion-promoting interlayer or an anti-halation layer is applied between the support and the light-sensitive layer.

The mixture according to the invention is composed of monomers, photoinitiators, binders and the disulfides described; however, it also may contain a number of further additives, for example, stabilizers or inhibitors for preventing a thermal polymerization of the copying layer, hydrogen donors, plasticizers, sensitometric regulators, and dyestuffs or colored pigments.

A large number of substances, for example benzoin, benzoin ethers, polynuclear quinones, for example 2-ethylanthraquinone; acridine derivatives, for example 9-phenylacridine, 9-p-methoxyphenyl-acridine, 9-acetylamino-acridine and benzo(a)acridine; phenazine derivatives, for example 9,10-dimethyl-benzo(a)phenazine, 9-methyl-benzo(a)phenazine and 10-methoxy-benzo(a)phenazine; quinoxaline derivatives, for example 6,4',4''-trimethoxy-2,3-diphenyl-quinoxaline and 4',4''-dimethoxy-2,3-diphenyl-5-aza-quinoxaline; quinazoline derivatives; synergistic mixtures of different ketones; dyestuff/redox systems; thiopyrylium salts and many others are suitable as photoinitiators.

Particularly suitable are the acridine and phenazine compounds described in German Pat. No. 2,027,467, the quinoxaline and quinazoline compounds described in German Pat. No. 2,039,861 and the benzalquinaldine compounds described in German Offenlegungsschrift No. 2,850,585. In general, the initiators are added in an amount of 0.01 to 10, preferably 0.2 to 5, percent by weight relative to the non-volatile constituents of the mixture.

Photopolymerizable monomers which are suitable for the purposes of the invention are known and are described, for example, in U.S. Pat. Nos. 2,760,863 and 3,060,023.

Preferred examples are acrylic and methacrylic acid esters of polyhydric alcohols, such as diglycerol diacrylate, polyethylene glycol dimethacrylate, acrylates and methacrylates of trimethylolethane, trimethylolpropane and pentaerythritol and of polyhydric alicyclic alcohols. Low molecular weight esters having a molecular weight below 1,000, in particular below 500, are generally preferred. Advantageously, reaction products of diisocyanates with partial esters of polyhydric alcohols are also used for certain purposes. Such monomers are described in German Offenlegungsschrift No. 2,064,079, and German Offenlegungsschrift No. 2,361,041.

The quantity of the monomers can differ very widely depending upon their nature and their molecular weight. In general it can be between about 10 and 80, preferably 20 and 60, percent by weight.

The hydrogen donors used are mainly aliphatic polyethers. If appropriate, this function also can be fulfilled by the binder or by the polymerizable monomer, if these possess labile hydrogen atoms.

A large number of soluble organic, preferably saturated polymers can be employed as binders. The following are exemplary: polyamides, polyvinyl esters, polyvinyl acetals, polyvinyl ethers, polyacrylic acid esters, polymethacrylic acid esters, polyesters, alkyd resins, polyacrylamide, polyvinyl alcohol, polyethylene oxide, polydimethylacrylamide, polyvinyl pyrrolidone, polyvinyl methylformamide, polyvinyl methylacetamide and copolymers of the monomers which form the homopolymers enumerated.

Other possible binders are natural substances or modified natural substances, for example gelatin, cellulose ethers and the like.

With particular advantage, binders are used which are insoluble in water, but soluble or at least swellable in aqueous-alkaline solutions, because layers with such binders can be developed with the preferred aqueous-alkaline developers. Such binders can contain, for example, the following groups: —COOH, —PO$_3$H$_2$, —SO$_3$H, —SO$_2$NH$_2$, —SO$_2$—NH—CO—, and the like. Exemplary of these are: maleate resins, polymers of N-(p-tolylsulfonyl)-carbamic acid β-methacryloyloxyethyl ester and copolymers of these and similar monomers with other monomers, and styrene/maleic anhydride copolymers. Methyl methacrylate/methacrylic acid copolymers and copolymers of methacrylic acid, alkyl methacrylates and methyl methacrylate and/or styrene, acrylonitrile and others, such as are described in German Auslegeschriften Nos. 2,064,080 and 2,363,806, are preferred.

The quantity of binder is in general 20 to 90, preferably 40 to 80, percent by weight of the non-volatile constituents of the mixture.

If the mixture is to be used for the manufacture of a printing plate, for example an offset printing plate, it is applied in the form of a solution to a layer support and is dried. The selection of the suitable supports is made in accordance with the type of printing plate. In general, aluminum is used, which preferably carries an anodically produced porous oxide layer. Advantageously, the aluminum is mechanically, chemically or electrolytically roughened before anodizing. Anodizing is carried out in known manner, for example in sulfuric and/or phosphoric acid, preferably under such conditions that an oxide layer having a layer weight of about 0.5 to 10 g/m² is obtained.

Before applying the light-sensitive layer, the oxide layer is advantageously subjected to a pretreatment, for example with silicates or polyvinyl phosphonic acid, in order to improve the technological properties in printing, in particular the hydrophilic character. The coating of the carrier material is carried out in known manner by whirler-coating, spraying, dipping, by means of rollers, slot dies, doctor blades or by caster application.

For the purpose of improved wetting, it is advantageous to add wetting agents or leveling agents to the coating solution, if appropriate.

For developing, the exposed printing plate is treated with a suitable developer solution, preferably a weakly alkaline aqueous solution, the unexposed areas of the layer being removed and the exposed areas of the copying layer, including the pigments contained in the layer, remaining on the support.

The predominant part of the above-mentioned disulfides is known from the literature. Disulfides of the general formula $R_1-CH_2-S-S-CH_2-R_2$, with $R_1 = R_2$, readily can be prepared, for example by oxidation of the corresponding mercaptans with $FeCl_3$ or iodine. Asymmetrical disulfides can be prepared, for example, by reacting sulfenyl chlorides with mercaptans.

In the following table, several compounds are listed, the activity of which in mixtures according to the invention was tested.

TABLE

Compounds of the formula $R_1-CH_2-S-S-CH_2-R_2$

| Compound No. | Melting Point, °C. | Substituents $R_1 = R_2$ |
|---|---|---|
| 1 | liquid | Heptyl- |
| 2 | 33 | Decyl- |
| 3 | 75 | Phenyl- |
| 4 | 157 | N-Phenyl-carbamoyl- |
| 5 | 164 | N-Phenyl-carbamoyl-methyl- |
| 6 | 173 | 4-Fluoro-N-phenyl-carbamoyl-methyl- |
| 7 | 174 | 3,4-Dimethyl-N-phenyl-carbamoyl-methyl- |
| 8 | 162 | 2,4-Dichloro-N-phenyl-carbamoyl-methyl- |

The invention is explained in more detail by reference to the Examples which follow and in which parts by weight (pbw) and parts by volume (pbv) have the same relationship as g and ml³. Unless otherwise stated, percentages are percent by weight.

EXAMPLE 1

(a) As the layer carrier for printing plates, electrochemically roughened and anodized aluminum with an oxide layer of 3 g/m² is used, which is coated with a solution of the following composition:
11.7 parts by weight of a 33.4% concentration solution of a methyl methacrylate/methacrylic acid copolymer, having an acid number of 110 and a mean molecular weight of 35,000, in methyl ethyl ketone,
3.9 parts by weight of trimethylolethane triacrylate,
0.07 part by weight of 9-phenyl-acridine,
0.07 part by weight of 4-dimethylamino-4'-methyl-dibenzalacetone,
0.04 part by weight of an azo dyestuff obtained from 2,4-dinitro-6-chloro-benzene diazonium salt and 2-methoxy-5-acetylamino-N-cyanoethyl-N-hydroxyethyl aniline,
38.0 parts by weight of ethylene glycol monoethyl ether, and
13.5 parts by weight of butyl acetate.

Application is effected by whirler-coating in such a way that a dry weight of 2.8–3 g/m² is obtained. Subsequently, the plate is dried for 2 minutes at 100° C. in a circulating air oven.

(b) A further plate is prepared as described under (a) and is then coated with a 15 percent concentration aqueous solution of polyvinyl alcohol (12 percent of residual acetyl groups, K-value 4). After drying, a cover layer having a weight of 4–5 g/m² is obtained.

(c) A further plate of the same material is coated with the solution described under (a), with the addition of 0.6 part by weight of compound 5 and is dried.

(d) A fourth plate is prepared as described under (c) and then provided with the polyvinyl alcohol cover layer described under (b).

The four printing plates obtained are each exposed by means of a 5 kW metal halide lamp under a 13-step exposure wedge, with density increments of 0.15, for 10, 20, 40, and 80 seconds.

The plates are then developed with a developer of the following composition:
120 parts by weight of sodium metasilicate.9H₂O,
2.13 parts by weight of strontium chloride,
1.2 parts by weight of a non-ionic wetting agent (coconut fatty alcohol polyoxyethylene ether with about 8 oxyethylene units),
0.12 part by weight of anti-foaming agent, and
4,000 parts by weight of fully desalinated water.

The plates are rendered acidic with 1 percent concentration phosphoric acid and inked with greasy printing ink. The following fully cross-linked wedge steps are obtained:

| Plate | Cover Layer | Compound 5 | Exposure Time (seconds) | | | |
|---|---|---|---|---|---|---|
| | | | 10 | 20 | 40 | 80 |
| a | without | without | — | 1 | 2 | 2 |
| b | with | without | 1 | 3 | 5 | 7 |
| c | without | with | 1 | 3 | 5 | 7 |
| d | with | with | 1 | 3 | 5 | 7 |

When adding the disulfide compound 5, the same copying result as with the use of a cover layer inhibiting the diffusion of oxygen, is obtained. A comparison of the results of (b) and (d) shows that compound 5 does not have any additional initiator activity, even though its quantity is a multiple of the quantity of phenylacridine and 4-dimethylamino-4-methyl-dibenzalacetone.

EXAMPLE 2

A solution of the following composition is whirler-coated onto an electrochemically roughened and anodized aluminum surface with an oxide layer of 3 g/m² in such a way that a layer weight of 3.5 g/m² is obtained:
10.0 parts by weight of a 20 percent concentration solution of a terpolymer of styrene, n-hexyl methacrylate and methacrylic acid (10:60:30), having an acid number of 190, in butanone, 2.0 parts by weight of the reaction product obtained from 1 mole of 2,2,4-trimethylhexamethylene diisocyanate and 2 moles of 2-hydroxy-ethyl methacrylate, 0.3 part by weight of 9-phenylacridine, 0.15 part by weight of 4-chloro-benzalquinaldine, 0.03 part by weight of methyl violet (C.I. 42,535), 0.3 part by weight of Compound No. 6, 18.0 parts by weight of butanone, and 7.5 parts by weight of butyl acetate.

The coated plate is then dried for 2 minutes at 100° C. in a circulating air oven.

A further plate is prepared in the same way, but without the addition of Compound 6.

Samples of each plate are now exposed for 5, 10, 20, and 40 seconds under a 13-step exposure wedge and are developed with a developer of the following composition:

5.3 parts by weight of sodium metasilicate.9H$_2$O, 3.4 parts by weight of tertiary sodium phosphate.12-H$_2$O, 0.3 part by weight of secondary sodium phosphate.12-H$_2$O, and 91.0 parts by weight of fully desalinated water.

The plates are rendered acidic with 1 percent concentration phosphoric acid and inked with greasy printing ink. The fully cross-linked wedge steps indicated in the table which follows are obtained:

| Compound 6 | Exposure time (seconds) | | | |
|---|---|---|---|---|
| | 5 | 10 | 20 | 40 |
| with | 2 | 3 | 4 | 5 |
| without | 2 | 3 | 3 | 3 |

The plate does not function strictly reciprocally. The number of wedge steps, however, increases linearly with the exposure time.

EXAMPLE 3

(a) A solution of the following composition is whirler-coated onto an electrochemically roughened, anodized aluminum surface with an oxide layer of 3 g/m$^2$ in such a way that a layer weight of 3 g/m$^2$ is obtained:

11.4 parts by weight of the copolymer solution indicated in Example 1, 37.9 parts by weight of ethylene glycol monoethyl ether, 13.45 parts by weight of butyl acetate, 4.0 parts by weight of trimethylolethane triacrylate, 0.07 part by weight of 4-methyl-benzalquinaldine, 0.08 part by weight of the azo dyestuff indicated in Example 1, 0.07 part by weight of 4-dimethylamino-4'-methyl dibenzalacetone, and 0.56 part by weight of Compound 2.

The coated plate is dried for 2 minutes in a drying oven at 100° C.

(b) A further plate is prepared in the same manner and provided with a cover layer of 4–5 g/m$^2$ of polyvinyl alcohol as in Example 1.

(c) A third plate is prepared as under (a), but without an addition of Compound 2.

(d) A fourth plate is prepared as under (c) and provided with a cover layer according to (b).

Samples of the offset printing plates obtained are exposed by means of a metal halide lamp of 5 kW for 10, 20 and 40 seconds under a 13-step exposure wedge with density increments of 0.15.

Subsequently, the plates are developed with the developer described in Example 1.

They are then rendered acidic with 1 percent concentration phosphoric acid and inked with greasy printing ink. The following number of fully cross-linked wedge steps is obtained:

| Plate | Cover Layer | Compound 2 | Exposure time (seconds) | | |
|---|---|---|---|---|---|
| | | | 10 | 20 | 40 |
| a | without | with | — | 1 | 3 |
| b | with | with | — | 1 | 3 |
| c | without | without | — | — | 2 |
| d | with | without | — | 1 | 3 |

EXAMPLE 4

Electrochemically roughened and anodized (oxide layer of 3 g/m$^2$) aluminum plates of 0.3 mm thickness are coated with a solution of the following composition in such a way that, after drying, a layer weight of 2.9 g/m$^2$ is obtained:

40 parts by weight of trimethylolethane triacrylate, 30 parts by weight of a terpolymer of styrene, n-hexyl methacrylate and methacrylic acid (10:60:30), having an acid number of 180, 2.3 parts by weight of 1-(2-quinolyl)-2-(2-fluorenyl)-ethylene, 0.8 part by weight of the dyestuff indicated in Example 1, 0.7 part by weight of 4-dimethylamino-4'-methyl-dibenzalacetone, 5.8 parts by weight of Compound No. 3, 360 parts by weight of methyl ethyl ketone, and 150 parts by weight butyl acetate.

As in Example 3, 4 plates are prepared, exposed and developed with the developer indicated in Example 1.

After inking with greasy printing ink, the following fully cross-linked gloss steps are obtained:

| Plate | Cover Layer | Compound 3 | Exposure Time (seconds) | | | |
|---|---|---|---|---|---|---|
| | | | 10 | 20 | 40 | 80 |
| a | without | with | — | 1 | 3 | 5 |
| b | with | with | 1 | 2 | 3 | 5 |
| c | without | without | — | — | 1 | 3 |
| d | with | without | — | 1 | 2 | 4 |

EXAMPLE 5

A solution as described in Example 2 is whirler-coated onto a cleaned carrier, which consists of an insulating material with a 35 μm copper deposit, in such a way that a layer thickness of about 5 μm is obtained. The layer is dried for a further 5 minutes at 100° C. in a circulating air oven. The coating and drying step can also be carried out on both sides.

Subsequently, samples of the material are exposed by means of a 5 kW metal halide lamp at a distance of 140 cm under a step wedge as described in Example 1 for 2, 4, 8, 16, 32, and 64 seconds, and the plates are developed with 0.8 percent concentration sodium carbonate solution in a spraying apparatus for 30 to 60 seconds.

Corresponding to the exposure time, the following fully cross-linked wedge steps are obtained. If appropriate, the number including the almost completely cross-linked steps is indicated in brackets.

| Exposure time | Fully Cross-linked Wedge Steps |
| --- | --- |
| 2 seconds | 3 |
| 4 seconds | 4 |
| 8 seconds | 5 (6) |
| 16 seconds | 7 (8) |
| 32 seconds | 9 |
| 64 seconds | 10 (11) |

If the cross-linkable layer is exposed under a circuit original and developed, the cross-linked areas are resistant to the conventional iron-III chloride etching solution customary in printed circuit board technology. The etch resistance is good.

It will be obvious to those skilled in the art that many modifications may be made within the scope of the present invention without departing from the spirit thereof, and the invention includes all such modifications.

What is claimed is:

1. A photopolymerizable mixture which comprises a polymeric binder, a compound which is polymerizable by a free radical mechanism and has at least two ethylenically unsaturated polymerizable groups, and an effective amount of a photoinitiator for initiating the photoinitiated free-radical addition polymerization of the polymerizable compound, and which additionally contains an effective amount of a disulfide compound to reduce the sensitivity of the mixture to oxygen, said disulfide compound having the formula $R_1-CH_2-S-S-CH_2-R_2$ in which $R_1$ and $R_2$ are identical or different and are alkyl, cycloalkyl, aryl, aralkyl or N-substituted carbamoyl or carbamoylalkyl groups.

2. A photopolymerizable mixture as claimed in claim 1, which contains the disulfide compound in a quantity of 0.1 to 10 percent by weight, relative to non-volatile constituents.

3. A photopolymerizable mixture as claimed in claim 1 which contains an acridine, phenazine, quinoxaline, quinazoline or benzalquinaldine compound as the photoinitiator.

4. A photopolymerizable mixture as claimed in claim 1 which contains a binder which is soluble in dilute aqueous-alkaline solutions.

5. A photopolymerizable mixture as claimed in claim 1 which contains an acrylic or methacrylic acid ester of a polyhydric alcohol, of a molecular weight of less than 1,000, as the photopolymerizable compound.

6. A photopolymerizable copying material with a layer support and a photopolymerizable layer which contains a polymeric binder, a compound which is polymerizable by a free radical mechanism and has at least two ethylenically unsaturated polymerizable groups, and an adequate quantity of a photoinitiator for initiating the photoinitiated free-radical addition polymerization of the polymerizable compound, and which additionally contains an effective amount of a disulfide compound to reduce the sensitivity of the mixture to oxygen, said disulfide compound having the formula $R_1-CH_2-S-S-CH_2-R_2$ in which $R_1$ and $R_2$ are identical or different and are alkyl, cycloalkyl, aryl, aralkyl or N-substituted carbamoyl or carbamoylalkyl groups.

* * * * *